United States Patent
Val et al.

[11] Patent Number: 5,847,448
[45] Date of Patent: Dec. 8, 1998

[54] METHOD AND DEVICE FOR INTERCONNECTING INTEGRATED CIRCUITS IN THREE DIMENSIONS

[75] Inventors: Christian Val, St remy les Chevreuses; Michel Leroy, Chatou, both of France

[73] Assignee: Thomson-CSF, Paris, France

[21] Appl. No.: 749,660

[22] Filed: Nov. 15, 1996

Related U.S. Application Data

[63] Continuation of Ser. No. 289,855, Aug. 12, 1994, abandoned, which is a continuation of Ser. No. 920,482, filed as PCT/FR91/00978 Dec. 6, 1991, abandoned.

[30] Foreign Application Priority Data

Dec. 11, 1990 [FR] France ................. 90 15473

[51] Int. Cl.⁶ .......................... H01L 23/02; H01L 23/34
[52] U.S. Cl. .................. 257/686; 257/724; 257/725; 257/748; 257/774
[58] Field of Search ................... 257/686, 748, 257/774, 696, 723, 724, 725

[56] References Cited

U.S. PATENT DOCUMENTS

| | | | |
|---|---|---|---|
| 3,746,934 | 7/1973 | Stein | 317/101 |
| 4,706,166 | 11/1987 | Go | 257/686 |
| 4,754,316 | 6/1988 | Reid | 257/686 |
| 4,939,568 | 7/1990 | Kato et al. | 257/686 |
| 4,953,005 | 8/1990 | Carlson et al. | 257/686 |
| 4,956,694 | 9/1990 | Eide | 257/686 |
| 4,956,695 | 9/1990 | Robinson et al. | 257/686 |
| 5,016,138 | 5/1991 | Woodman | 257/686 |
| 5,019,946 | 5/1991 | Eichelberger et al. | 361/414 |
| 5,043,794 | 8/1991 | Tai et al. | 357/74 |
| 5,051,865 | 9/1991 | Kato | 257/686 |
| 5,281,852 | 1/1994 | Normington | 257/686 |
| 5,313,096 | 5/1994 | Eide | 257/686 |
| 5,561,682 | 10/1996 | Bertin et al. | 257/686 |
| 5,604,377 | 2/1997 | Palagonia | 257/686 |
| 5,648,684 | 7/1997 | Bertin et al. | 257/686 |

FOREIGN PATENT DOCUMENTS

| | | | |
|---|---|---|---|
| 0019186 | 11/1980 | European Pat. Off. | |
| 0354708 | 8/1989 | European Pat. Off. | |
| 0490739 | 12/1991 | European Pat. Off. | |
| 2645681 | 10/1990 | France | |
| 3233195 | 3/1983 | Germany | 257/686 |
| 0160641 | 8/1985 | Japan | 257/686 |
| 0156348 | 6/1988 | Japan | 257/686 |
| 1123427 | 5/1989 | Japan | |
| 3064934 | 3/1991 | Japan | |
| 3116860 | 5/1991 | Japan | |
| 0232256 | 10/1991 | Japan | 257/686 |
| 2000909 | 1/1979 | United Kingdom | 257/686 |

OTHER PUBLICATIONS

Val '3–D Interconnection for Ultra–Dense Multichip Modules' pp. 814–821, 1990.
Val '3–D Interconnection for Ultra–Dense Multichip Modules' 40th EEE Conf. pp. 539–547, 1990.
'Semiconductor Europa—the shape of things to come' Electronic Engineering pp. 49–55, May 1990.

Primary Examiner—David Ostrowski
Attorney, Agent, or Firm—Roland Plottel

[57] ABSTRACT

A method and device for interconnecting stacked semiconducting plates, in which each of the plates has an integrated circuit. The semiconducting plates (P) are stacked and made solid with each other. In one embodiment, their connecting contacts are connected by a wire (F) to any one of the faces of the stack except one (B), which is to be in contact with a printed circuit. Connections of the plates together and with the printed circuit is made on the faces ($F_V$, $F_S$, $F_L$) of the stack.

13 Claims, 6 Drawing Sheets

5,847,448

METHOD AND DEVICE FOR INTERCONNECTING INTEGRATED CIRCUITS IN THREE DIMENSIONS

This application is a continuation of application Ser. No. 08/289,855, filed Aug. 12, 1994 now abandoned which is a continuation of application Ser. No. 07/920,482 filed as PCT/FR91/00978 Dec. 6, 1991 now abandoned.

The subject of the present invention is a method and a device for interconnecting stacked semiconducting chips, each of the chips containing an integrated circuit.

It has already been proposed to make stacks of integrated circuits, as for example described in the U.S. Pat. No. 4,706,166. According to this embodiment, the chips are arranged on a printed circuit, placed side by side perpendicular to the printed circuit; the connecting contacts of each of the chips are brought onto the same side of the chip; this side is arranged on the printed circuit and the connections with the latter are made there. However, this arrangement has in particular limitations linked to the number of contacts which it is materially possible to arrange on one single side of a semiconducting chip; furthermore, it is expensive since the chips are not standard (the arrangement of the contacts must be modified); finally, the connections thus made are not very accessible and in addition not visible, which limits its use.

The subject of the present invention is a device for interconnecting stacked integrated circuits which avoids these problems and limitations by the use of the faces of the stack as an interconnection surface.

More precisely, plates formed from one or more semiconducting chips are stacked and made solid with each other; in one embodiment, their connecting contacts are each joined to any one of the faces of the stack except one, called the base, which is intended to be in contact with a printed circuit substrate. The connection of the plates together is made on the faces of the stack; if need be, the connection of the plates with the printed circuit is made via so-called stack contacts, formed on the faces of the stack, for example in the vicinity of the edges of the base, the connections linking the contacts together being formed on the faces of the stack and at least some of them being nonrectilinear.

Other objects, features and results of the invention will emerge from the following description, illustrated by the attached drawings which show:

FIG. 1, an exploded perspective view of an embodiment of the stack of semiconducting plates according to the invention;

FIG. 2, an exemplary plate inserted in the stack of the preceding figure;

FIG. 3, a first embodiment of the method for interconnecting a stack according to the invention;

FIG. 4, a fractional sectional view of a practical embodiment of the stack according to the invention;

FIG. 5, an embodiment of the plates connections on the faces of the stack according to the invention;

FIGS. 6a and 6b, detail embodiments of the preceding figure;

FIG. 7, another embodiment of the method according to the invention;

FIG. 8, a fractional view of a step of the method of the previous figure;

FIG. 9, variant embodiment of the plate connections on the faces of the stack according to the invention.

In these various figures, the same references refer to the same elements. Furthermore, for clarity of the drawings, they are not true to scale.

FIG. 1 is therefore an exploded view of a stack according to the invention of semiconducting plates.

In this figure, a plurality of plates P are therefore found (three plates on the diagram) arranged parallel to each other. The plates P can be semiconducting chips or a ceramic or epoxy printed circuit, including one or more semiconducting chips. The stack is for example closed by a first insulating plate $F_V$, forming the front face and a second insulating plate $F_R$, forming the rear face.

FIG. 2 shows, by way of example, a plate P of the stack of the preceding figure, made up by a semiconducting chip.

The latter is composed of a semiconducting plate 20 in which an integrated circuit, of any type, is made, for example a memory. On the surface of the plate P, appear contacts $P_C$, arranged for example in the vicinity of two of the edges of the plate, allowing electrical connection of the circuit contained in the plate to the outside; the contacts $P_C$ can of course be arranged around the four sides of the plate P, or even at any point on its surface.

The stack of FIG. 1 is, in this embodiment, intended to be arranged on a printed circuit board CI via one of its faces B, called the base. The front and rear faces $F_V$ and $F_R$, for example, carry so-called stack contacts $P_E$, intended for connecting the stack to the other circuits carried by the printed circuit CI. These stack contacts $P_E$ are arranged for example in the vicinity of the base B.

FIG. 3 illustrates an exemplary embodiment of the method for interconnecting a stack according to the invention.

The first step, labelled 61, consists in electrically joining the contacts $P_C$ of the plates P to the lateral faces of the stack. This stage is illustrated in FIG. 4, which is a section according to the plane A—A of FIG. 1.

In FIG. 4, are again found the front face $F_V$, the rear face $F_R$ and, between these two faces, three plates P. As it is known, the surface of each of these plates is covered by an insulating layer 30, except at the sites of the connecting contacts $P_C$.

According to the invention, a conducting wire F is connected, for example by soldering, onto each of the contacts $P_C$ of each of the plates. Each of the wires F is directed towards one of the faces of the stack, according to the connection needs. In FIG. 4, by way of example, the wires F shown have been directed towards the same face. In a variant embodiment, the wires F can be replaced by conducting strips. In order to simplify the description, mention will henceforth be made only of "conducting wires" or of "conductors" F.

During the following step (62, FIG. 3), the stacking of the plates P is carried out. In a variant embodiment, each of the plates P can be, before stacking, covered by a drop of insulating protecting material (silicone or analogue), as is usual for the protection of semiconducting chips. The incorporation of the whole is then carried out with the help of an insulating material D, such as an epoxy resin. For clarity of FIG. 4, the dielectric material D has not been hatched although seen in section. The stack is then cut or polished so that the wires F are flush on the faces of the stack.

The following step (63, FIG. 3) consists in depositing one (or more) conducting layer M, for example metallic, on all the faces of the stack thus made up.

The following step (64, FIG. 3) consists in making on the lateral faces of the stack, from the layer M, connections joining the wires F together and to the contacts $P_E$.

FIG. 5 shows a stack according to the invention on which are shown exemplary connections.

In this figure, are found the stack comprising the front face $F_V$, the base B, the face opposite the base (upper face)

which is labelled $F_S$ and the two remaining faces $F_L$ which are called lateral faces. The wires F are seen to be flush on one lateral face $F_L$. They are both interconnected together and joined to stack contacts $P_E$ with the help of connections C. Also shown, still by way of example, are some wires F which are flush on the upper face $F_D$ (sic) of the stack and each joined to a distinct stack contact $P_E$ by a connection C. Again by way of example, contacts $P_E$ have been shown on the face $F_V$ in the vicinity of the base, but it is understood that they can occupy any position on the faces of the stack, except on the base B.

FIG. 6a shows a fractional and expanded view of a part of the stack of FIG. 5, where a connection C and a stack contact $P_E$ are seen. FIG. 6b is a sectional view according to an axis BB of FIG. 6a.

Each of the connections C is formed by two etchings 51 and 52, made with the help of a laser which locally destroys the metallic layer M and reveals the insulating layer D (stippled on FIG. 6a for clarity of the diagram), thus bringing about electrical insulation of the connection C from the rest of the layer M.

Figure 6A:
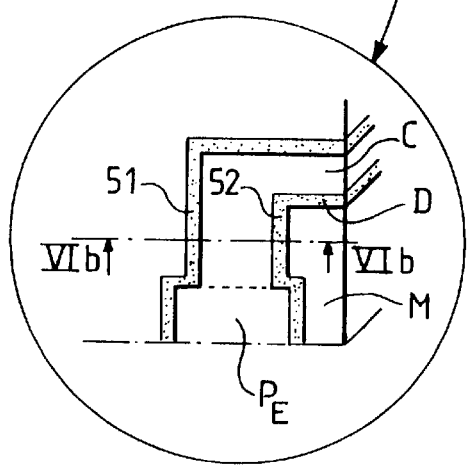
FIGS. 6a and 6b illustrate in more detail the step 64 of making the connections C.

The stack contacts $P_E$ can advantageously be made by the same technique of laser etching, as shown in FIG. 6a.

In a variant embodiment, the contacts $P_E$, when they are located in the vicinity of the base, are slightly extended on the latter so as to make mounting and connection of the stack easier when they are made on the surface, that is to say without connection pins.

Figure 7:
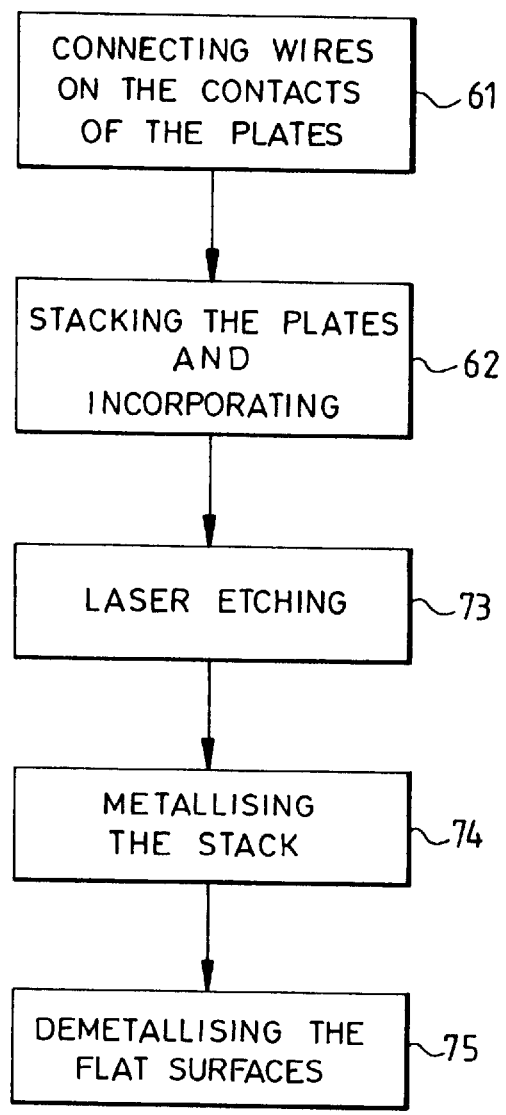

FIG. 7 shows another embodiment of the method according to the invention.

Figure 3:
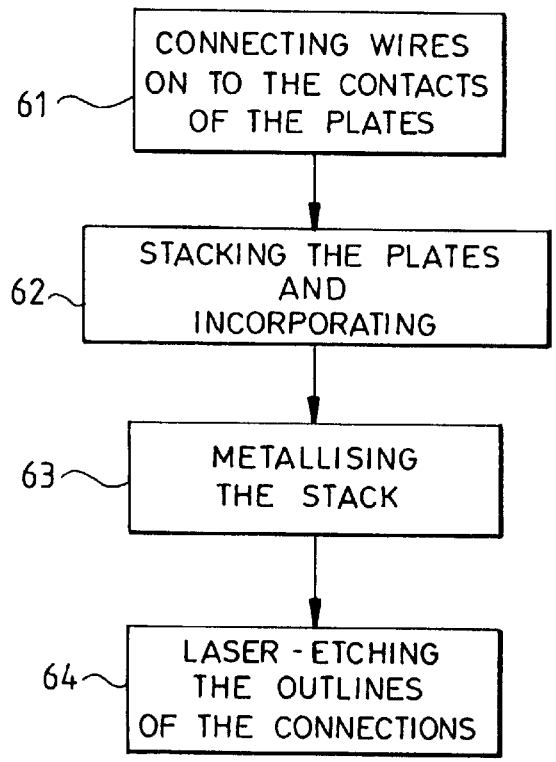

The two first steps of the method, namely connecting wires (or strips) onto the contacts $P_C$ of the plates P (step 61), stacking and incorporating the plates (step 62), are identical to what was described in FIG. 3.

Figure 4:
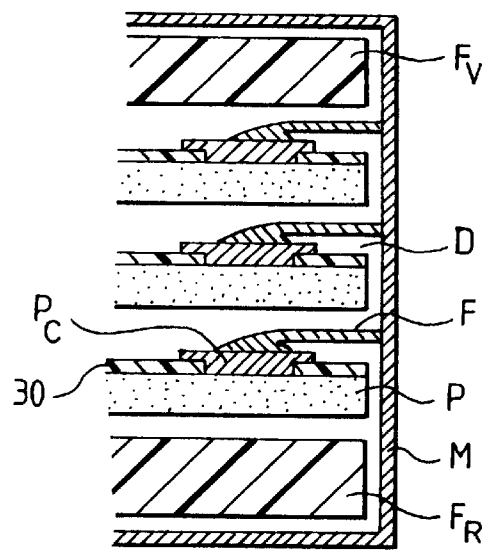
Figure 5:
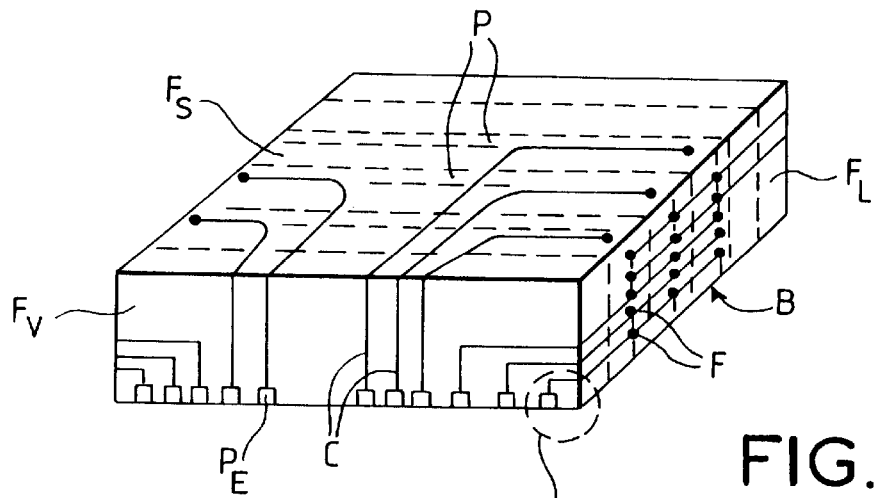

The following step (73) consists in making a groove in the stack, at the level where the wires F are flush so as to clear the end of the latter. This stage has been illustrated in FIG. 8 where by way of example an alignment of five wires F has been copied from the face $F_L$ of FIG. 5, the groove being labelled 81 and the stack, E. These grooves such as 81 can be made by laser etching in the insulating material D (see FIG. 4).

The following step (74) consists in depositing a conducting layer (for example metal) on the complete stack, that is to say faces of the stack, grooves (such as 81) and wires F.

Finally, the last step (75) shown in FIG. 7 consists in removing the conducting layer from the flat surfaces of the stack, so as only to leave it remaining in the grooves such as 81 where it makes the connection sought. This last step can be carried out for example by polishing or with the help of a laser.

Figure 8:
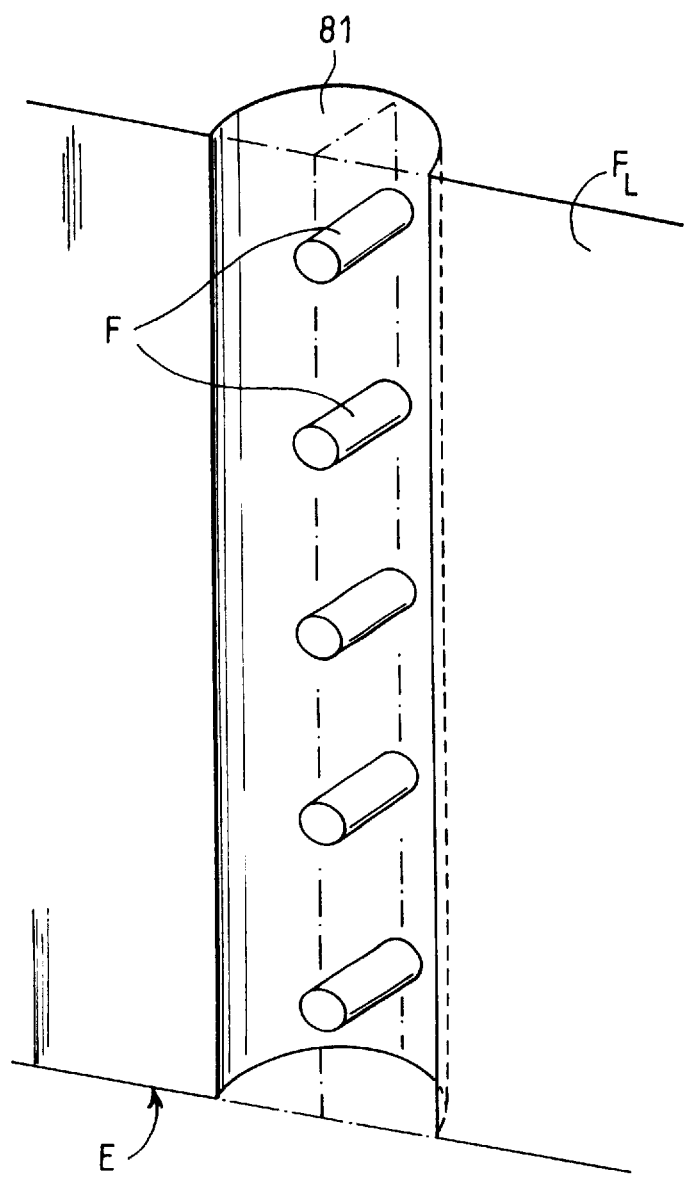

In FIG. 8 by way of example a straight groove 81 has been shown joining aligned wires F, but the grooves can of course take any shape and join any wire F as a function of the connections to be made.

This embodiment has the advantage, compared to the preceding one, of allowing a smaller connection spacing.

Figure 9:
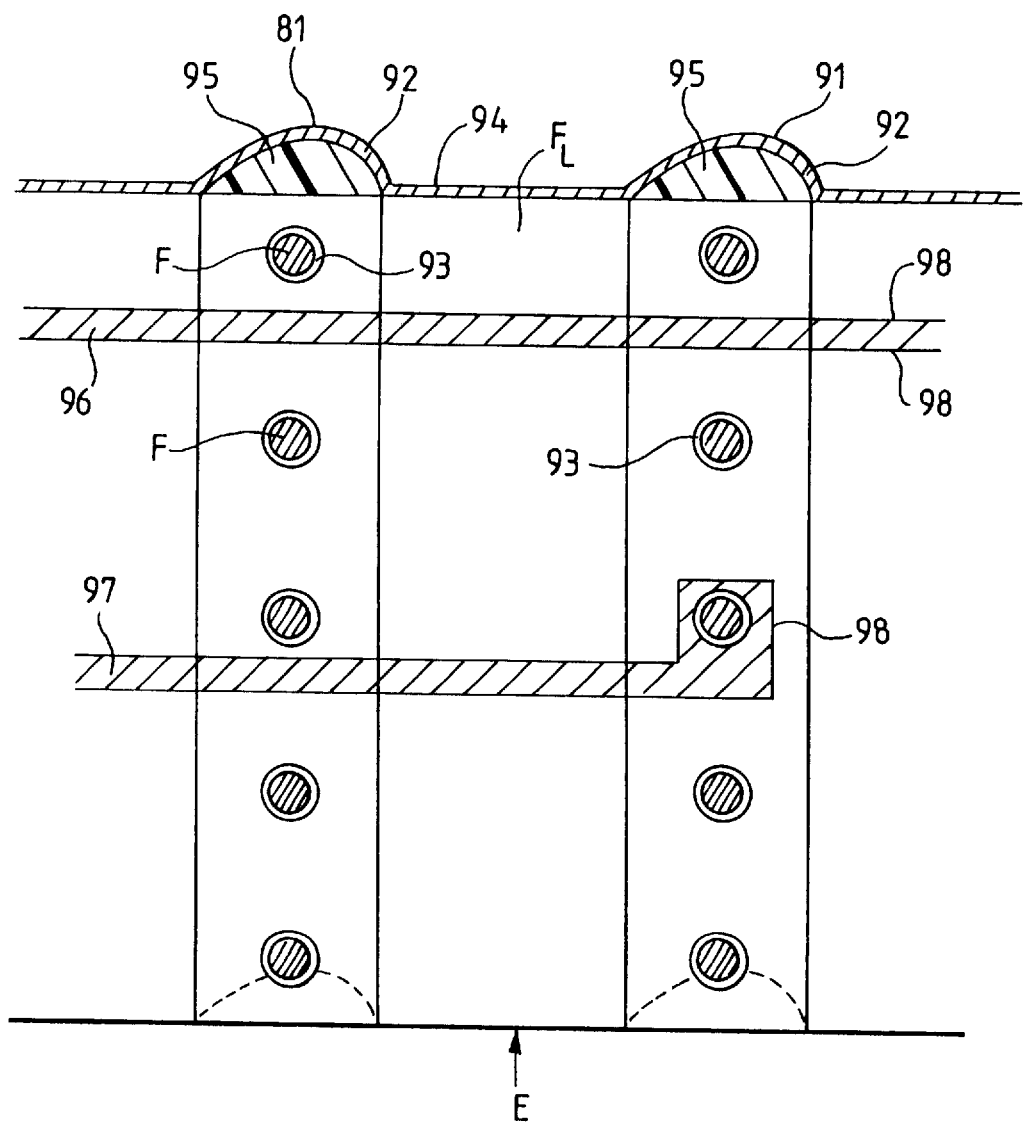

FIG. 9 illustrates a variant embodiment of the connections of the plates on the faces of the stack according to the invention.

In this figure has been shown the stack E as obtained after the method described in FIG. 7, that is to say having grooves (81, 91) formed at the level of the wires F, the grooves and the wires being metallised (layers 92 and 93 respectively) and the flat faces $F_L$ of the stack being demetallised.

According to this variant embodiment, deposition of an insulating material 95 is carried out in each of the grooves so as to fill them in. If necessary, the cross section of the wires F is then cleaned so as to allow subsequent electrical connection.

Figure 6B:
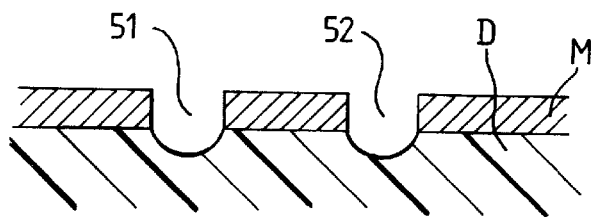

The following step consists in metallising again the whole of the stack E then in etching in the latter conducting layer the outlines (98) of the connections (96, 97) to be made, analogously to what is described above (step 64 of FIG. 3 in conjunction with FIGS. 6).

By way of example, only two connections have been shown in FIG. 9, which have been hatched for readability of the figure, one (97) connecting one of the wires F of the groove 91 with other contacts not shown and the other (96) crossing the two grooves (91, 81), without electrical connection.

This variant embodiment thus allows crossings of connections to be simply made at the surface of the stack.

It appears that in this way has been made a stack of plates containing integrated circuits which can be identical to each other or nonidentical, both on the electrical level and on the level of the geometry of the plate. These plates are interconnected together through the faces of the stack, without needing to pass through the printed circuit, which allows the number of stack contacts $P_E$ to be reduced or, conversely, the number or the complexity of the stackable plates to be increased.

Also, the fact of joining the contacts $P_C$ of the plates to the stack faces through wires allows these wires to be made to come out on any face (apart from the base). In a variant embodiment, the wires F can be individually insulated. In addition, connection to the printed circuit is done through the stack contacts $P_E$ which can be placed on any of the faces $F_V$, $F_R$ or $F_L$ and which, because of this, can be numerous. Finally, the contacts $P_E$-printed circuit connections are accessible and visible, which reduces the cost thereof and permits certain applications, in particular military ones.

Figure 1:
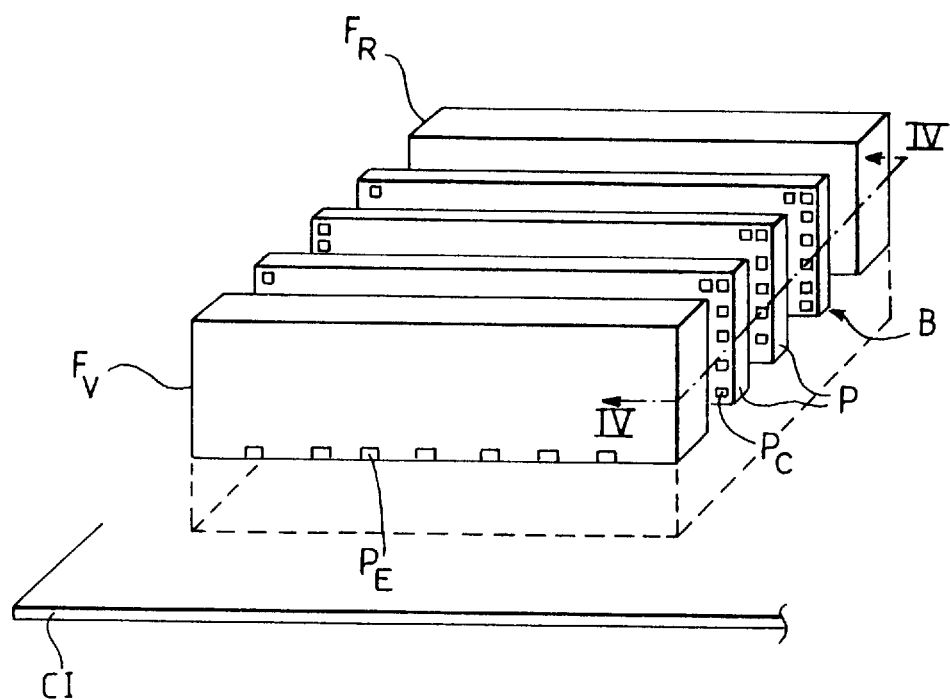
Figure 2:
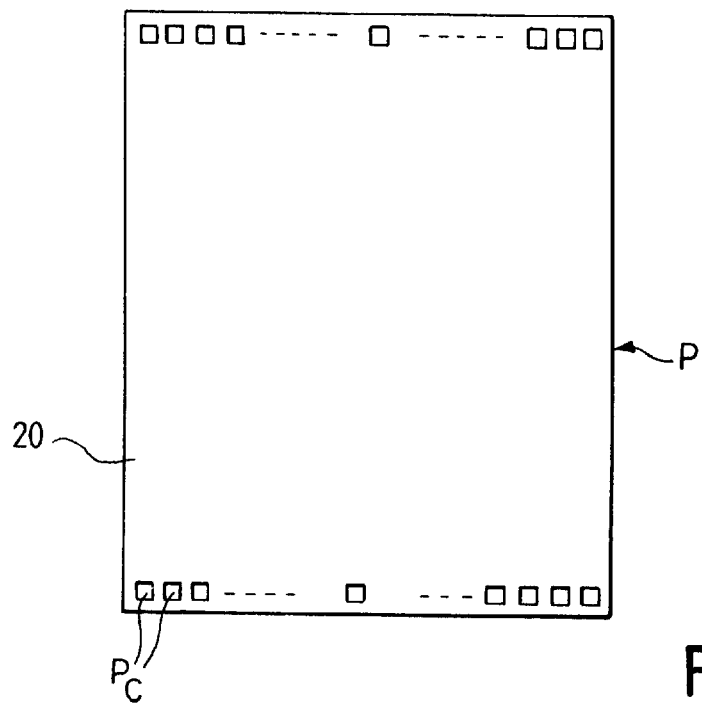

The description given above was of course so done by way of nonlimiting example. Thus for example, the stack was described such that the plates are perpendicular to the printed circuit but the stacking can be carried out in the other direction and the plates be parallel to this printed circuit. Also, the stack contacts $P_E$ were illustrated on the faces $F_V$ and $F_R$, but can be arranged on any of the faces of the stack and anywhere on these faces, according to the application; in fact, when the stack is, as shown in FIG. 1, intended to be arranged on a printed circuit, the contacts $P_E$ can be arranged on any face, except the base, but preferably in the vicinity of the edges of the base; but it is also possible to interconnect two (or more) stacks together, in which case the contacts $P_E$ can occupy any position. In the same way, a method of making the connections C by laser was described using an etching technique but a technique of deposition with the help of a laser can also be used; for this, the stack is placed in an organometallic vapour and with the help of the laser the zone where it is desired to form the connection is heated; the heating causes decomposition of the vapour and deposition of the metal at the desired place; deposition of a local insulating layer is done, as required, analogously by adapting the composition of the vapour. Finally, a single layer of connections C on the stack was shown, but several can be arranged (insulated from each other), for example by the laser deposition technique described above, for example so as to allow crossings of connections.

We claim:

1. Device for interconnecting semiconducting plates (P), each containing at least one integrated circuit and comprising electrical connecting contacts ($P_C$) wherein the plates (P) are separated from and made solid with each other by being embedded and enveloped in an electrically insulating material (D) and are arranged with said material in the form of a solid stack having faces with said electrically insulating material on said faces, the electrical connecting contacts ($P_C$) of the plates being joined electrically by conductors (F) extending to some of the faces of the stack, and the electrical linking of the conductors (F) together is performed by connections (C) on the electrically insulating faces of the stack, these connections being arranged on at least two faces of the stack.

2. Device according to claim 1, wherein at least one of the faces of the stack, called the base (B), does not comprise conductors (F), that the stack comprises stack contacts ($P_E$) formed on its surface in the vicinity of the base, intended for connecting the stack with outside circuits, and that the connections (C) ensure furthermore linking of the conductors with the stack contacts.

3. Device according to claim 1, wherein the conductors (F) are wires.

4. Device according to claim 1, wherein the conductors (F) are strips.

5. Device according to claim 3, wherein the conductors (F) are individually insulated.

6. Device according to claim 1, wherein the connections (C) are conductive strips deposited on the stack faces.

7. Device according to claim 1, wherein the conductors (F) are formed in grooves in the stack and are flush with the adjacent surface of the stack, the grooves being filled with a conductive material.

8. The device according to claim 1 wherein the connections (C) are formed in grooves in the stack, the grooves being filled with a conductive material, and said material in the grooves being flush with the face of the stack.

9. The device according to claim 1 wherein the conductors (F) are embedded in the insulating material (D) and in a region of the face protrude from said material, said material being absent from the region immediately surrounding the protruding end of the conductor, with said absent insulating material (81) forming an indentation from said face, whereby said electrical connections (C) make a good electrical contact with said protruding end of said conductors.

10. The device according to claim 1 wherein the conductors (F) are embedded in the insulating material (D), and which material is absent from an area (81) immediately surrounding the conductor at the face, so that the conductor protrudes into the area, said area being lined with a metallic conductive layer (92), and with an insulating material (95) thereon flush with said face.

11. The device according to claim 10 wherein said area is a groove extending along said face.

12. Device for interconnecting semiconducting plates (P), each containing at least one integrated circuit and comprising electrical connecting contacts ($P_C$) wherein the plates (P) are separated from and made solid with each other by being embedded and enveloped in an electrically insulating material (D) and are arranged with said material in the form of a solid stack with surfaces of said electrically insulating material (D), the electrical connecting contacts ($P_C$) of the plates being joined electrically by conductors (F) extending to outer faces of some of the surfaces of the stack, and the electrical linking of the conductors (F) together is performed by connections (C) on the outer surfaces of the electrically insulating faces of the stack, these connections being arranged on at least two faces of the stack.

13. Device for interconnecting semiconducting chips, comprising a plurality of chips (P) each containing at least one integrated circuit and connecting contacts ($P_C$), the chips (P) being made solid with each other with the help of an insulating material (D) in order to form a stack, the connecting contacts ($P_C$) of the chips being joined electrically by conductors (F) to at least some of the faces of the stack, the electrical linking of the conductors (F) together being performed by connections (C) on the faces of the stack, at least some of these connections being arranged on at least two faces of the stack and these connections consist of a conducting layer (92) arranged in a groove (81) joining the conductors together.

* * * * *